United States Patent
Urard et al.

(10) Patent No.: US 10,585,143 B2
(45) Date of Patent: Mar. 10, 2020

(54) FLIP FLOP OF A DIGITAL ELECTRONIC CHIP

(71) Applicants: STMICROELECTRONICS SA, Montrouge (FR); STMICROELECTRONICS (CROLLES 2) SAS, Crolles (FR); STMICROELECTRONICS INTERNATIONAL N.V., Schiphol (NL)

(72) Inventors: Pascal Urard, Theys (FR); Florian Cacho, Grenoble (FR); Vincent Huard, Le Versoud (FR); Alok Kumar Tripathi, Ghaziabad (IN)

(73) Assignees: STMICROELECTRONICS INTERNATIONAL N.V., Schiphol (NL); STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 49 days.

(21) Appl. No.: 16/031,960

(22) Filed: Jul. 10, 2018

(65) Prior Publication Data
US 2019/0018062 A1 Jan. 17, 2019

(30) Foreign Application Priority Data
Jul. 11, 2017 (FR) ...................................... 17 56565

(51) Int. Cl.
*G01R 31/3183* (2006.01)
*G01R 31/3185* (2006.01)
(Continued)

(52) U.S. Cl.
CPC . *G01R 31/318342* (2013.01); *G01R 31/3177* (2013.01); *G01R 31/31725* (2013.01);
(Continued)

(58) Field of Classification Search
CPC ...... G01R 31/318342; G01R 31/31725; G01R 31/3177; G01R 31/31816;
(Continued)

(56) References Cited

U.S. PATENT DOCUMENTS

| 6,169,501 B1 * | 1/2001 | Ryan | H03M 9/00 341/100 |
|---|---|---|---|
| 6,359,946 B1 * | 3/2002 | Ryan | H03L 7/00 327/141 |

(Continued)

OTHER PUBLICATIONS

Dixius et al., "A Deep-Submicron CMOS Flow for General-Purpose Timing-Detection Insertion," Proceedings of the 22nd International Conference "*Mixed Design of Integrated Circuits and Systems*", Toruń, Poland, Jun. 25-27, 2015, pp. 248-253.
(Continued)

*Primary Examiner* — Kyle Vallecillo
(74) *Attorney, Agent, or Firm* — Seed Intellectual Property Law Group LLP (57) ABSTRACT

A flip flop includes a data input, a clock input, a test chain input, a test chain output, a monitoring circuit, and an alert transmission circuit. The monitoring circuit is adapted to generate an alert if the time between arrival of a data bit and a clock edge is less than a threshold. The alert transmission circuit is adapted to apply during a monitoring phase an alert level to the test chain output in the event of an alert generated by the monitoring circuit, and to apply the alert level to the test chain output when an alert level is received at the test chain input.

20 Claims, 6 Drawing Sheets

(51) Int. Cl.
*G01R 31/3177* (2006.01)
*G01R 31/317* (2006.01)
*G01R 31/3181* (2006.01)
*G06F 17/50* (2006.01)

(52) U.S. Cl.
CPC .......... *G01R 31/31816* (2013.01); *G01R 31/318541* (2013.01); *G01R 31/318552* (2013.01); *G01R 31/318594* (2013.01); *G06F 17/5031* (2013.01)

(58) Field of Classification Search
CPC .... G01R 31/318541; G01R 31/318552; G01R 31/318594; G06F 17/5031
See application file for complete search history.

(56) References Cited

U.S. PATENT DOCUMENTS

| | | | |
|---|---|---|---|
| 2002/0044325 A1* | 4/2002 | Noguti | H03L 7/095 398/202 |
| 2002/0199161 A1 | 12/2002 | Yamamoto et al. | |
| 2013/0076398 A1* | 3/2013 | Pechaud | G01R 31/31726 327/31 |
| 2013/0169331 A1* | 7/2013 | Jain | H03K 3/0375 327/199 |
| 2014/0132293 A1* | 5/2014 | Abadir | G01R 31/2882 324/750.3 |
| 2014/0132315 A1* | 5/2014 | Sharma | G01R 31/2884 327/142 |
| 2015/0177321 A1 | 6/2015 | Gherman | |
| 2017/0161416 A1* | 6/2017 | Miro Panades | G06F 17/5077 |

OTHER PUBLICATIONS

Kunitake et al., "Possibilities to Miss Predicting Timing Errors in Canary Flip-flops," *IEEE 54th International Midwest Symposium on Circuits and Systems*, Seoul, South Korea, Aug. 7-10, 2011, 4 pages.
Sato et al., "Exploiting Input Variations for Energy Reduction," *PATMOS, LNCS* 4644:384-393, 2007.

* cited by examiner

Fig 11

FLIP FLOP OF A DIGITAL ELECTRONIC CHIP

BACKGROUND

Technical Field

The present application concerns the field of electronic circuits, and in particular a flip flop allowing, in a digital chip, the storage of a binary data bit used by the chip.

Description of the Related Art

In a digital chip such as a microprocessor, binary data is stored in flip flops. At every edge of a clock signal, such as every rising edge, each flip flop stores a data bit. The various data is then processed by the chip. Binary data resulting from the processing operation arrives at the various flip flops and is stored at the next clock edge. In order for the microprocessor to operate without errors, the presentation of a data bit at a flip flop should not occur too close to the occurrence of a clock edge, since this would result in uncertainty as to whether or not that data bit has been taken into account by the flip flop. Thus, a data bit resulting from a processing operation should be presented to a flip flop while maintaining a time margin—or setup time—prior to a clock edge.

The time taken by a processing operation to provide all the data to the flip flops may vary between different identical chips manufactured at the same time or coming from different batches, due to the variability of the manufacturing process. Furthermore, in a same chip, this time will depend on parameters such as the operating temperature, the power supply voltage, and various voltages such as for example biasing voltages of wells, which are sometimes called the back gates, in and on which are formed the transistors that perform the processing. Furthermore, this time depends on the age of the chip and the various operating phases it has undergone.

The known techniques making it possible to maintain the time margin present various problems of implementation and of operation.

BRIEF SUMMARY

One embodiment aims to at least partially address some or all of the drawbacks described above.

Thus, an embodiment provides a flip flop comprising: a data input and a clock input; a test chain input and a test chain output; a monitoring circuit adapted to generate an alert if the time between arrival of a data bit and a clock edge is less than a threshold; and an alert transmission circuit, adapted to apply during a monitoring phase an alert level to the test chain output in the event of an alert generated by the monitoring circuit, and to apply the alert level to the test chain output when an alert level is received at the test chain input.

According to an embodiment, the alert transmission circuit is adapted to maintain, after application of the alert level, the alert level at the test chain output until the arrival of a reset signal at the alert transmission circuit.

According to an embodiment, the alert transmission circuit comprises an asynchronous latch receiving the output of an OR gate having an input receiving the alert and another input coupled to the test chain input.

According to an embodiment, the monitoring phase is that during which a monitoring control signal is applied, the reset signal corresponding to the absence of the monitoring control signal.

According to an embodiment, the flip flop comprises: a first latch activated during a first state of the clock signal, in series with a second latch activated during a second state of the clock signal; a third latch in series with the first latch, activated during the first state of the clock signal; and an exclusive OR gate between the output of the first latch and the output of the third latch.

Another embodiment provides an electronic chip comprising a plurality of the above flip flops, coupled in a test chain by their test chain inputs and outputs, the monitoring phase being common to the various flip flops.

According to an embodiment, the test chain further comprises further flip flops not having monitoring circuits, each one comprising a test chain input and output and a multiplexer adapted to apply the alert level to the test chain output during the monitoring phase if the test chain input is at the alert level.

According to an embodiment, the electronic chip comprises a control circuit adapted to receive the alert generated by any one of the flip flops and to perform one or more countermeasures of the following list: slow down the clock signal; increase the power supply voltage of the transistors of the chip; modify the back gate voltages of the transistors; and modify the accuracy of the digital processing.

Another embodiment provides a storage device storing a library of standard cells for the design of electronic chips, the library comprising a standard cell defining an above flip flop.

According to an embodiment, the library further comprises a further standard cell defining a further flip flop not having a monitoring circuit, comprising a test chain input, a test chain output, and a multiplexer adapted to apply the alert level to the test chain output during the monitoring phase if the test chain input is at the alert level.

Another embodiment provides a method of chip design performed by a computer, the method comprising: a) performing timing analysis; b) identifying the flip flops to be monitored; and c) replacing each flip flop to be monitored by an above flip flop.

According to an embodiment, the method comprises: defining a test chain comprising said flip flops to be monitored; and replacing by the above further flip flop each flip flop of the test chain that is not a flip flop to be monitored.

BRIEF DESCRIPTION OF THE SEVERAL VIEWS OF THE DRAWINGS

These characteristics and advantages, as well as others, shall be explained in detail in the following description of particular embodiments provided without limitation in connection with the appended figures, among which.

DETAILED DESCRIPTION

The same elements have been denoted by the same references in the different figures and, moreover, the different figures are not drawn to scale. For reasons of clarity, only the elements useful to the comprehension of the described embodiments have been represented and are detailed. In particular, a control circuit making it possible to take steps to maintain a time margin is not described in detail, the skilled person being capable of implementing this circuit from the functional indications provided in the present description.

In the present description, the term "connected" designates a direct electrical connection between two elements, while the term "coupled" or "linked" designates an electrical connection between two elements which may be direct or through one or more passive or active components, such as resistors, capacitors, inductors, diodes, transistors, etc.

Figure 1:
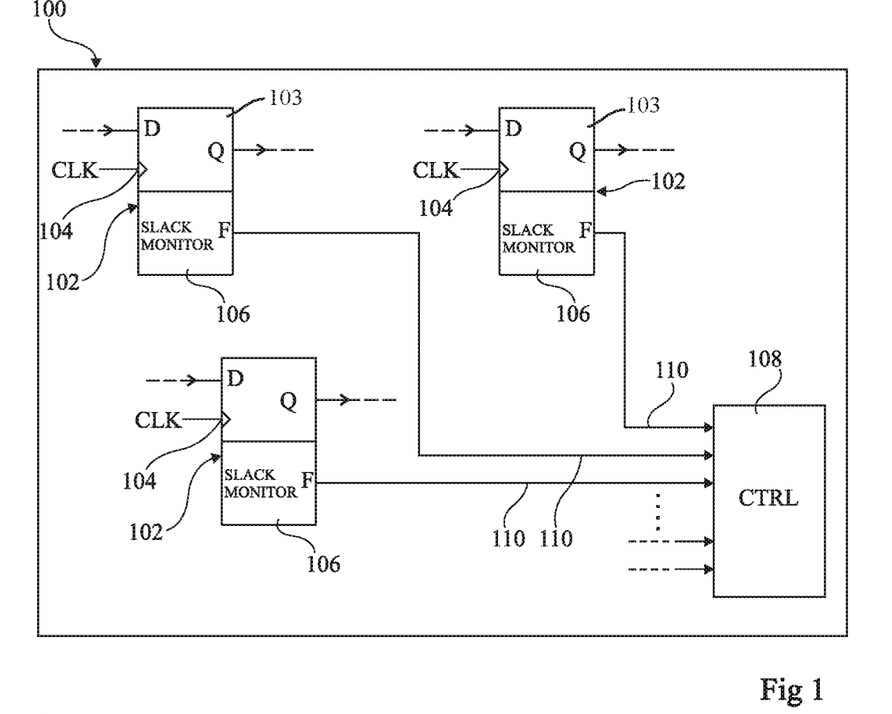
FIG. 1 schematically illustrates a digital chip.

FIG. 1 schematically illustrates a digital chip 100. The chip 100 comprises various elementary flip flops 102. The flip flops 102 receive and store data coming from circuit paths. Each elementary flip flop 102 comprises a latch 103 having one data input D, one data output Q, and one clock input 104 coupled to a clock line CLK. Each elementary flip flop 102 also comprises a monitoring circuit (SLACK MONITOR) 106 adapted to generate an alert at an output F if the time between the arrival of a data bit and a clock edge is less than a threshold. Such monitoring circuits are known in the prior art. For example, a publication by Y. Kunitake et al. entitled "Possibilities to Miss Predicting Timing Errors in Canary Flip-flops", IEEE, 7 Jan. 2011, describes one type of monitoring circuit used in a "canary flip flop".

Elementary flip flops 102 are positioned for example on critical paths in the circuit. Critical paths are paths identified as having a relatively long propagation time, and these paths are thus liable to be the first cause of a system failure.

As an example, three elementary flip flops 102 are shown in FIG. 1, although in practice, the number of flip flops of this type in a digital chip is much larger, typically hundreds or even thousands. In practice, the chip further comprises flip flops (not represented in FIG. 1) not equipped with a monitoring circuit and designed to receive and store data not coming from critical paths.

A control circuit 108 (CTRL) receives the various alerts coming from the various monitoring circuits, by conductive tracks 110.

In the event of an alert, the control circuit 108 enables steps to be taken to maintain the time margin between the arrival of data and the clock edges, for example increasing the power supply voltages, modifying the back gate voltages of the transistors, slowing down the frequency of the clock signal, or modifying the accuracy of the data processing. Some of these steps may be taken by circuits external to the chip.

In a circuit, the larger the number of flip flops equipped with a monitoring circuit, the more the circuit is protected against the risk of timing faults. However, when this number is high, there also exists an elevated number of conductive tracks 110 going to the control circuit 108. This elevated number of tracks is difficult to implement and occupies a major portion of the surface of the chip. Moreover, the processing of the alert signals on these tracks by the control circuit requires a logic unit of substantial size. In practice, this leads to limiting the amount of critical data being monitored.

Furthermore, the critical paths to be monitored by flip flops 102 are identified for example during the chip design, with the aid of a computer model. For this, a library of standard cells is for example used. Each cell describes a component such as a flip flop, a logic gate, etc. The functioning of a processing operation is simulated and the paths having the longest propagation times are determined, these paths being the critical paths. The positions of the flip flops 102 and of the tracks 110 are then defined. The tracks 110 occupy a sizeable surface, and one can perform further simulations for identifying new critical paths, and redesign a corresponding track 110 for each new flip flop 102 to be inserted.

Figure 2:
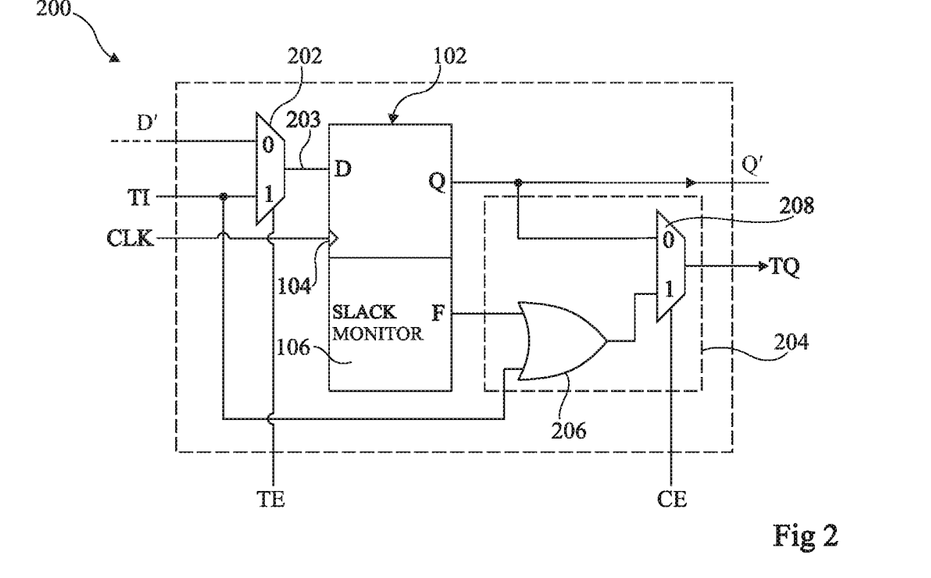
FIG. 2 schematically illustrates one embodiment of a flip flop.

FIG. 2 schematically illustrates one embodiment of a flip flop circuit 200. The flip flop circuit 200 comprises an elementary flip flop 102 for data storage, that includes the elements of the flip flop 102 described in relation with FIG. 1, namely, a latch 103, having a data input D, a data output Q, and a clock input 104 coupled to a clock line CLK, and a monitoring circuit (SLACK MONITOR) 106 adapted to generate an alert signal at the alert output F if the duration between the arrival of a data bit and a clock edge is less than a threshold. The data output Q of the flip flop 102 corresponds to the data output Q' of the flip flop circuit 200.

The flip flop circuit 200 further comprises a test chain input TI and a test chain output TQ. This type of flip flop circuit is commonly called "scan chain flip flop". Such a flip flop circuit comprises for example a multiplexer 202 controlled by a test control signal TE. In the example of FIG. 2, in the low level state of the signal TE, the output of the multiplexer corresponds to the data input D' of the flip flop 200, and in the high level state of the signal TE, the output of the multiplexer corresponds to the test chain input TI of the flip flop, although the states of the signal TE and the inputs of the multiplexer may be reversed. The output of the multiplexer is coupled to the data input D of the flip flop 102. Such a flip flop provided with a test chain input and output enables the operation of the chip to be tested after manufacture, in a manner which will be described below with reference to FIG. 3A.

The flip flop circuit 200 comprises an alert transmission circuit 204. As an example, the alert transmission circuit 204 comprises an OR gate 206, which receives the test chain input signal from the test chain input TI and the alert signal from the alert output F of the monitoring circuit 106. The transmission circuit 204 comprises a multiplexer 208 controlled by a monitoring control signal CE. In the example of FIG. 2, in the low level state of the signal CE, the output of the multiplexer 208 corresponds to the data output Q of the flip flop 102 (input "0"), and in the low level state of the signal CE, the output of the multiplexer 208 corresponds to the output of the OR gate 206 (input "1"), although the states of the signal CE and the inputs of the multiplexer may be reversed. The output of the multiplexer provides a test chain output signal at the test chain output TQ of the flip flop 200 circuit.

Flip flop circuits of the type of the flip flop circuit 200 may be used in a chip for monitoring the time margin of each data bit coming from a critical path, as described below in relation with FIG. 3A.

Figure 3A:
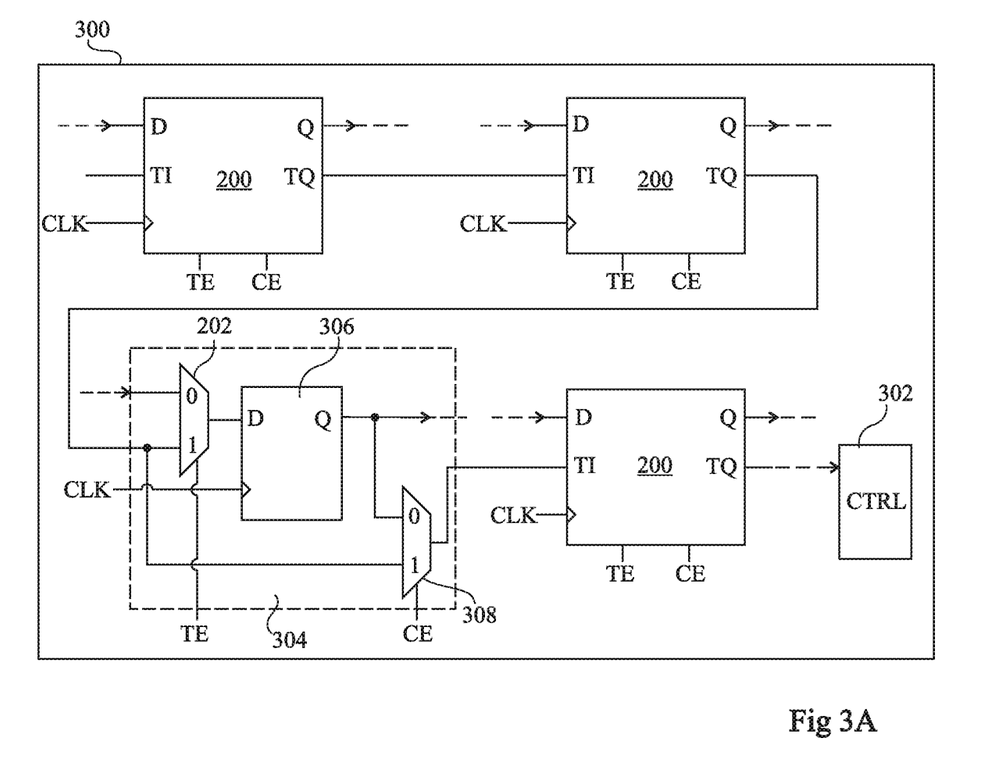
FIG. 3A schematically illustrates a chip comprising flip flops of FIG. 2.

FIG. 3A schematically illustrates one embodiment of a chip 300 comprising flip flop circuits 200 of the type illustrated in FIG. 2. Each flip flop circuit 200 corresponds to a data bit coming from a critical path. As an example, three flip flop circuits 200 are represented, but in practice, the chip may contain hundreds or even thousands of flip flop circuits 200.

The flip flop circuits 200 are coupled in a test chain, that is, the test chain output TQ of each flip flop circuit 200 is coupled to the test chain input TI of the following flip flop 200 in the chain, the output TQ of the last flip flop 200 of the chain being coupled to a control circuit 302 (CTRL). Like the control circuit 108 of FIG. 1, the control circuit 302 makes it possible to take steps aimed at maintaining the time margin. The test control signal TE and monitoring control signal CE are common to the different flip flop circuits of the chain.

As an example, the test chain further comprises a flip flop circuit 304 between two flip flop circuits 200. The flip flop circuit 304 is not adapted to be coupled to a critical path, nor is it equipped with a monitoring circuit. The flip flop circuit 304 comprises a test chain input and a test chain output. The flip flop further comprises a multiplexer 202 controlled by the test control signal TE. In the example of FIG. 3A, in the low level state of the signal TE, the output 203 of the multiplexer 202 corresponds to the data input of the flip flop circuit 304, and in the high level state of the signal TE, the output of the multiplexer 202 corresponds to the test chain input TI, although the states of the signal TE and the inputs of the multiplexer may be reversed. The output of the multiplexer 202 is coupled to the data input D of a flip flop 306. The flip flop 306 forms part of the flip flop circuit 304 and provides the output data of the flip flop circuit 304 from the data output Q of the flip flop 306. The flip flop circuit 304 further comprises a multiplexer 308 controlled by the monitoring control signal CE. The multiplexer 308 provides the test chain output TQ of the flip flop circuit 304. In the example of FIG. 3, in the low level state of the signal CE, the output of the multiplexer 308 corresponds to the output data from the data output Q, and in the high level state of the signal CE, the output of the multiplexer 306 corresponds to the test chain input TI, although the states of the signal CE and the inputs of the multiplexer may be reversed.

Figure 3B:
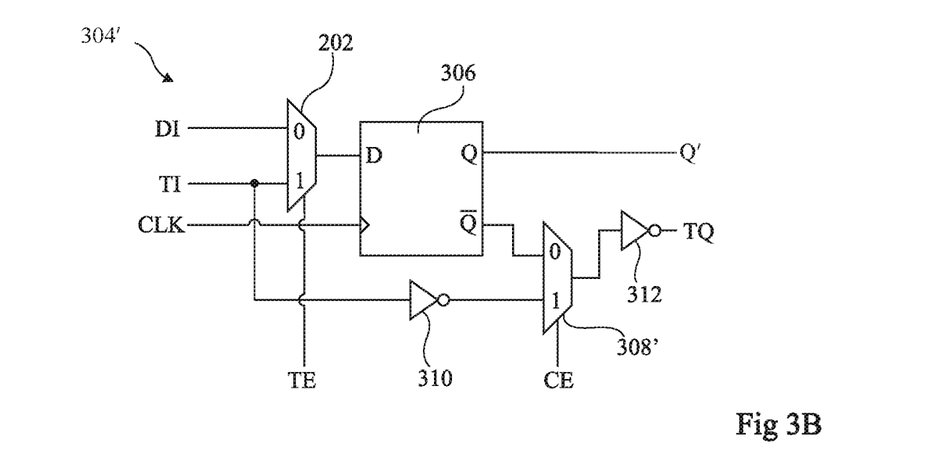
FIG. 3B schematically illustrates one embodiment of a flip flop.

FIG. 3B schematically illustrates a flip flop circuit 304' that is similar to the flip flop circuit 304 of FIG. 3A except that the multiplexer 308 is replaced by a multiplexer 308' controlled by the signal CE. In the example of FIG. 3B, in the low level state of the signal CE, the output of the multiplexer 308' corresponds to an inverted data output Q of the flip flop 306, and in the high level state of the signal CE, the multiplexer 308' corresponds to the output of an inverter 310 having its input coupled to the test chain input TI. The states of the signal CE and the inputs of the multiplexer may be reversed. The output TQ of the flip flop circuit 304' is provided by the output of an inverter 312 receiving the output of the multiplexer 308'.

During a test phase, the test control signal TE is for example in the high state and the monitoring control signal CE is for example in the low state. At each rising clock edge, the data is shifted by one flip flop circuit 200, 304, or 304' in the flip flop chain, thus making it possible to test the operation of the entire chip.

During the operation of the chip, the monitoring control signal CE is for example in the high state during a monitoring phase, and the functioning of the chain is described below in relation to FIG. 4.

Figure 4:
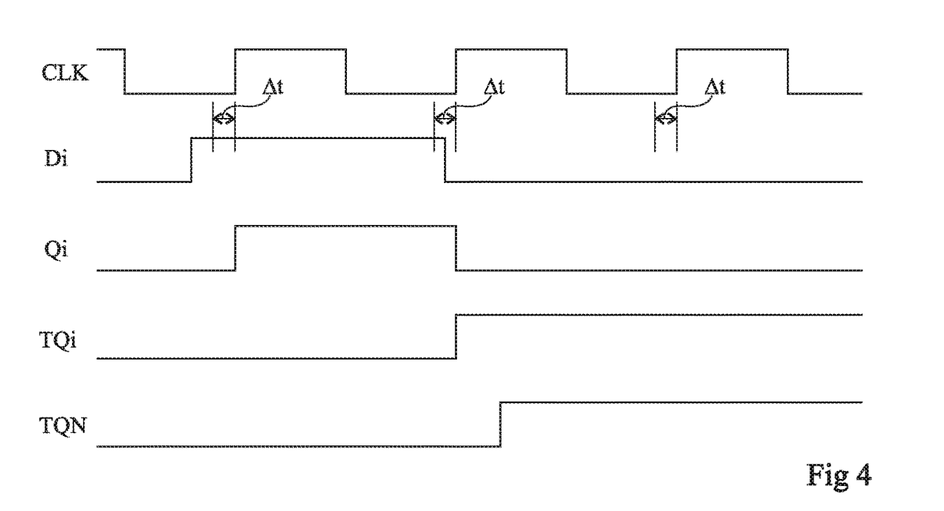
FIG. 4 is a timing diagram of five signals in the chip of FIG. 3A during its operation.

FIG. 4 is a timing diagram illustrating, in the chip 300 of FIG. 3A during its operation, an example of a clock CLK, an example of a data input Di of one of the flip flop circuits 200 of the chain, an example of the data output Qi of the same flip flop circuit 200, an example of the test chain output TQi of the same flip flop circuit 200, and an example of a test chain output TQN received from the last flip flop circuit of the chain by the control circuit 302.

The clock signal CLK is a square wave signal, of which three rising edges are represented. Data arrives at the input Di before each rising edge, the successive values of the data being given here as an illustration. The signal Qi takes the value of the data bit at each clock edge. The output TQi of the flip flop is initialized at a low level at the start of the monitoring phase. As mentioned above, the monitoring circuit 106 is adapted to generate an alert at the alert output F if the time between the arrival of a data bit and a clock edge is less than a threshold, that is, if the data bit arrives within a period Δt ending at the rising edge. As an example, the period Δt has a duration of between 20 and 40 ps. In the example illustrated, the data bit arrives during the period Δt associated with the second rising edge. An alert signal is then generated by the monitoring circuit and applied to the output TQi by the transmission circuit 204. As an example, the transmission circuit 204 then maintains the alert signal. In each of the following flip flop circuits of the chain, the alert signal arrives at the input TI of the flip flop circuit, and the transmission circuit 204 then applies this signal to the corresponding output TQ. The alert is thus propagated along the chain, for example in an asynchronous manner, and arrives at the test chain output TQN and at the control circuit 302.

The period Δt is chosen for example to have a longer duration than the setup time of the flip flop, and the alert is thus generated before a timing error occurs in the circuit. The alert signal thus provides a warning allowing the triggering of a countermeasure before the functioning of the circuit is compromised.

According to one advantage, an alert signal generated by any one of the flip flop circuits 200 will be present at the output TQN of the last flip flop circuit of the chain. Thus, there is no need to provide a conductive track for each flip flop circuit 200, unlike the flip flops 102 of FIG. 1. Thus, the implementation of the flip flop circuits 200 is particularly simple.

According to another advantage, connecting tracks between output TQ and input TI of neighbouring flip flop circuits of the chain serve at the same time for the test phase and for the monitoring phase. This enables one to use a reduced number of tracks and enables a particularly simple implementation.

According to another advantage, because of the ease of implementation, the time margins of a particularly elevated percentage of flip flops of the chip may be monitored.

The chip is for example adapted to comprise one or more chains of flip flop circuits 200 and optionally flip flop circuits 304, 304'. For certain portions of the chip not comprising any path identified as being critical, chains of flip flops of classical type, having a test chain input and output but lacking a monitoring and/or transmission circuit, are for example used.

Figure 5:
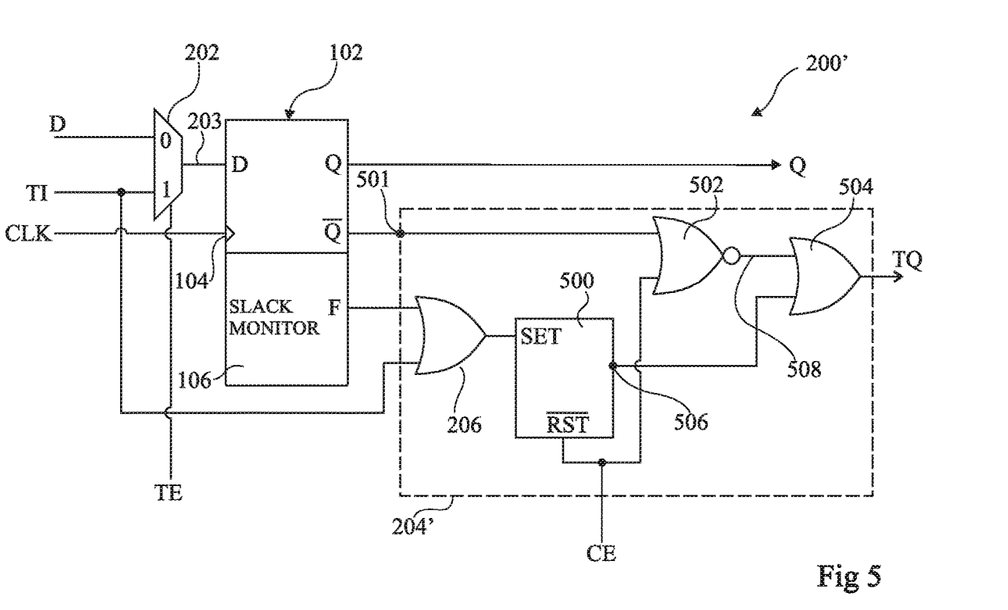
FIG. 5 schematically illustrates, in a more detailed manner, an embodiment of a flip flop.

FIG. 5 schematically illustrates, in a more detailed manner, one embodiment of a flip flop circuit 200' of the type of the flip flop circuit 200 of FIG. 2, which may be used in a chain of flip flop circuits of the type described in relation with FIG. 3A. The flip flop circuits 200 and 200' comprise common elements which are not described here once more, and only the differences between the flip flop circuits 200 and 200' are described.

The flip flop circuits 200' corresponds to the flip flop circuits 200, in which the transmission circuit 204 is replaced by a transmission circuit 204'. The transmission circuit 204' comprises an OR gate 206 having an input coupled to the alert signal output of the monitoring circuit 106, and another input coupled to the test chain input TI. The output of the OR gate is connected to one high level setting input (SET) of a latch 500. The latch 500 has a low level setting input (RST) receiving the monitoring control signal CE. The flip flop 102 has an inverted data output Q, corresponding to a node 501, coupled to an input of a NOR gate 502 having another input receiving the signal CE. An OR gate 504 receives the output 506 of the latch 500 and the output 508 of the NOR gate 502, and provides the test chain output TQ of the flip flop 200'.

Because the output 506 is at low level when the signal CE is at low level, the functioning of the NOR gate 502 and of the OR gate 504 is equivalent to that of the multiplexer 208 of the flip flop circuit 200 of FIG. 2.

In the monitoring phase, in a chain of the type of that of FIG. 3A, because of the presence of the latch 506, an alert level is maintained at the test chain output TQ after the generation of an alert signal by the monitoring circuit or after the appearance of an alert level at the test chain input TI. The alert level is maintained until the end of the monitoring phase. Once the alert signal is taken into account by the control circuit 302, the control circuit 302 terminates the monitoring phase by setting the signal CE at the low level, thus enabling the output TQ to be reset to the low level. A new monitoring phase may then be commenced.

According to one advantage, because the alert signal is maintained until it is taken into account by the control circuit, a failure to take into account some of the generated alert signals is avoided. Because the resetting to a low level of the output TQ is accomplished by setting the control signal CE to a low level, there is no need to provide the various flip flops with a supplementary reset signal.

Figure 6:
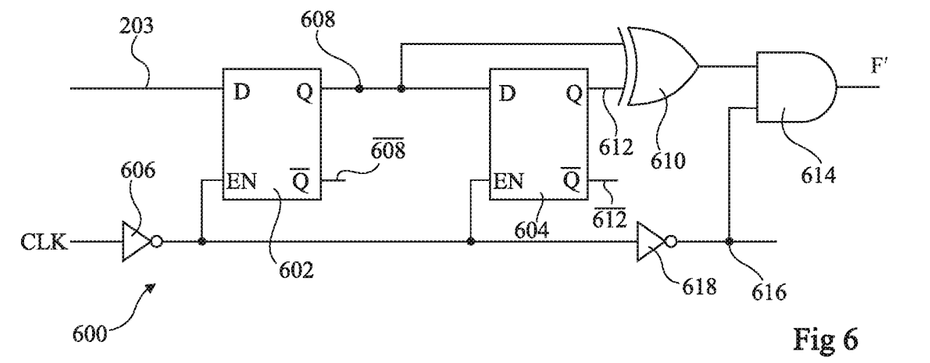
FIG. 6 schematically illustrates an example of a time margin monitoring circuit of an embodiment of a flip flop.

FIG. 6 schematically illustrates one embodiment of a monitoring circuit 600, which may replace the monitoring circuit 106 in a flip flop circuit of the type of flip flop circuit 200 of FIG. 3A or 200' of FIG. 5.

The monitoring circuit 600 comprises a first data storage latch 602 and a second data storage latch 604. The data input D of the latch 602 corresponds to the output 203 of the multiplexer 202 of the flip flop circuit 200. The data output Q of the latch 602 is connected to the data input D of the latch 604. The latches 602 and 604 each have a validation input EN and each one stores the level present at its data input when the validation input is at the high level. The validation inputs EN of the latches 602 and 604 of the monitoring circuit are controlled by the output of an inverter 606 receiving the clock signal CLK. The data output Q of the latch 602 corresponds to a node 608 and is coupled to an input of an exclusive OR gate 610. The data output Q of the latch 604 corresponds to a node 612 and is coupled to the other input of the exclusive OR gate 610. An AND gate 614 receives the output of the exclusive OR gate 610 and receives the output 616 of an inverter 618. The inverter 618 receives the output of the inverter 606. The AND gate 614 provides the alert signal F'.

The generation of an alert signal by the monitoring circuit 600 is now explained. The latches 602 and 604 are both enabled, in this example embodiment, when the clock signal CLK is at low level. When a data bit arrives at the input 203 of the latch 602, the data bit reaches the node 608 before it reaches the output 612 of the latch 604. The exclusive OR gate 610 is at its high output level while the output nodes 608 and 612 are at different levels, until the data bit is present at both output nodes 608 and 612. This high output level is transmitted by the AND gate 614 if the clock level changes to the high level before the nodes 608 and 612 are in the same logical state. This happens when the data bit that arrived prior to the rising edge of the clock signal is stored in the latch 602, but has not had enough time to reach the output of the latch 604 before the rising edge generated by inverter 618 has arrived.

Figure 7A:
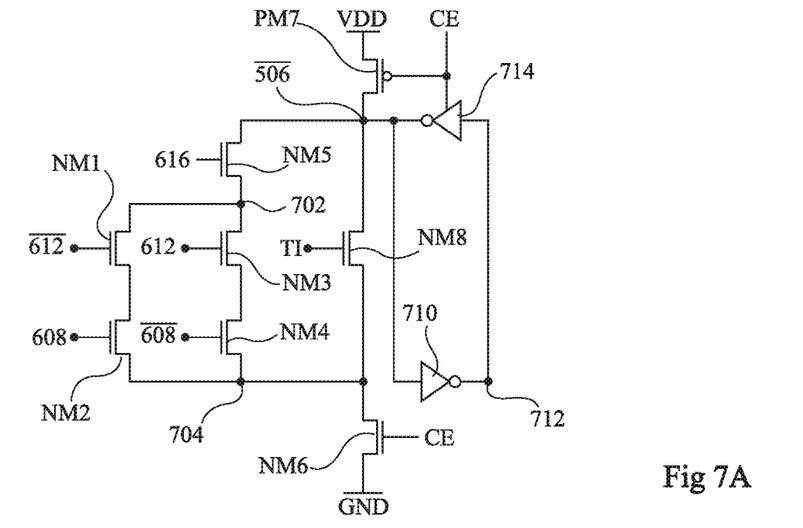
FIGS. 7A, 7B, 8 and 9 schematically illustrate in a more detailed manner examples of various parts of an embodiment of a flip flop.
Figure 7B:
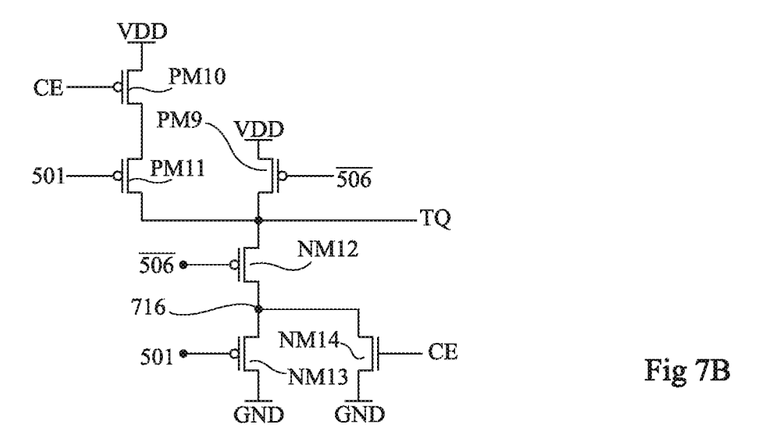

FIGS. 7A and 7B schematically illustrate in a more detailed manner portions of the flip flop circuit 200' of FIG. 5. FIG. 7A schematically illustrates an exemplary embodiment of the OR gate 206, the latch 500, the exclusive OR gate 610, and the AND gate 614, of the flip flop 200'. This circuit is connected to the nodes 608, 612 and 616, and to the inverted output nodes $\overline{Q}$, respectively $\overline{608}$ and $\overline{612}$, of the latches 602 and 604. FIG. 7B illustrates an exemplary implementation of the gates 502 and 504 of the flip flop 200'.

In FIG. 7A, a series association of two N-channel MOS transistors NM1 and NM2, and a series association of two N-channel MOS transistors NM3 and NM4, are in parallel between a node 702 and a node 704. The transistor NM1 has its gate coupled to the node $\overline{612}$, the transistor NM2 has its gate coupled to the node 608, the transistor NM3 has its gate coupled to the node 612, and the transistor NM4 has its gate coupled to the node $\overline{608}$. The node 702 is coupled to a node $\overline{506}$ by an N-channel MOS transistor NM5, controlled by the clock node 616. The node $\overline{506}$ corresponds to the inverse of the output 506 of the latch 500. The node 704 is coupled to a node for application of a low reference voltage, such as the ground GND, by an N-channel MOS transistor NM6. The node $\overline{506}$ is coupled to a node for application of a high power supply voltage VDD, or node VDD, by a P-channel MOS transistor PM7. The transistors NM6 and PM7 are controlled by the control signal CE. An N-channel MOS transistor NM8 couples the nodes 704 and $\overline{506}$. The transistor NM8 has its gate coupled to the test chain input TI of the flip flop 200. An inverter 710 has its input connected to the node $\overline{506}$ and its output 712 connected to the input of a three-state inverter 714 controlled by the signal CE. The output of the inverter 714 is connected to the node $\overline{506}$. The inverters 710 and 714 are thus cross-coupled and form the latch 500 of FIG. 5.

In FIG. 7B, the test chain output TQ is coupled to the node VDD by a P-channel MOS transistor PM9 in parallel with a series association of two P-channel MOS transistors PM10 and PM11. The transistor PM10 is controlled by the signal CE. The transistor PM11 has its gate connected to the node 501 of inverted data output $\overline{Q}$ of the flip flop 200'. The transistor PM9 has its gate connected to the node $\overline{506}$.

The output TQ is coupled to a node 716 by an N-channel MOS transistor NM12. The transistor NM12 has its gate connected to the node $\overline{506}$. The node 716 is coupled to ground GND by two transistors NM13 and NM14 in parallel. The transistor NM13 has its gate connected to the node $\overline{506}$ and the transistor NM14 is controlled by the signal CE.

Figure 8:
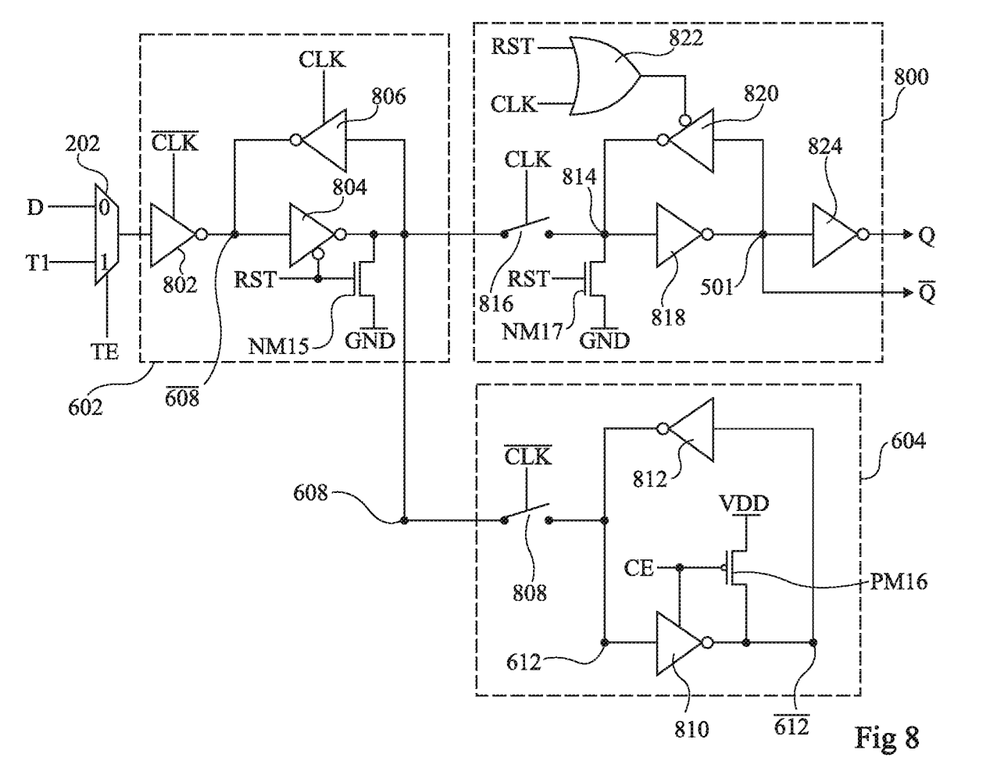

FIG. 8 schematically illustrates, in a more detailed manner, an embodiment of the latches 602 and 604 of the monitoring circuit, and of a part of the flip flop circuit 200 allowing the storage of the data bit at the rising edge of the clock signal. This portion comprises the latch 602 and a latch 800.

The data input of the latch 602 corresponds to the input of a three-state inverter 802 controlled by the inverse of the clock signal CLK and having its output corresponding to the node $\overline{608}$. An inverter 804, such as a three-state inverter and controlled by the inverse of a reset signal (RST), has its input coupled to the node $\overline{608}$ and its output connected to the node 608. An N-channel MOS transistor NM15, controlled by the reset signal, can couple the node 608 to ground GND. A three-state inverter 806, controlled by the clock signal CLK, is cross-coupled with the inverter 804 between the nodes 608 and $\overline{608}$.

In the latch 604, the input node 608 is coupled to the node 612 by a switch 808 controlled by the inverse $\overline{\text{CLK}}$ of the clock signal CLK, for example obtained from the signal CLK by an inverter. The node 612 corresponds to the input of an inverter 810 having its output corresponding to the node $\overline{612}$. An inverter 812 cross-coupled with the inverter 810 couples the nodes 612 and $\overline{612}$. As an example, the inverter 810 is a three-state inverter and is controlled by the signal CE, and a transistor PM16 controlled by the signal CE couples the node $\overline{612}$ to the node VDD.

In the latch 800, the node 608 is coupled to a node 814 by a switch 816 controlled by the clock signal CLK. The node 814 corresponds to the input of an inverter 818 having its output corresponding to the node 501 of the inverted data output $\overline{Q}$ of the flip flop. A three-state inverter 820 controlled by the inverse of the clock signal couples the nodes 501 and 814, cross-coupled with the inverter 818. As an example, the inverter 820 is further controlled by the inverse of the reset signal RST, the signal RST and the signal CLK then for example being provided at the inputs of an OR gate, and the inverter 820 being controlled for example by the inverse of the output of the OR gate 822. An N-channel MOS transistor NM17 controlled by the signal RST may then couple the node 814 to ground GND. The data output Q of the flip flop circuit 200 is the output of an inverter 824 having its input connected to the node 501.

According to one advantage, because the latch 602 is common to the monitoring circuit and to the portion enabling the data bit to be stored at the rising edge of the clock signal, the flip flop circuit 200 comprises a particularly reduced number of components and uses a particularly reduced surface of the chip.

Furthermore, the latches 602 and 800 may be used in the absence of the latch 604, in an identical configuration, to obtain a flip flop of the type of flip flop 306 of FIGS. 3A and 3B.

Figure 9:
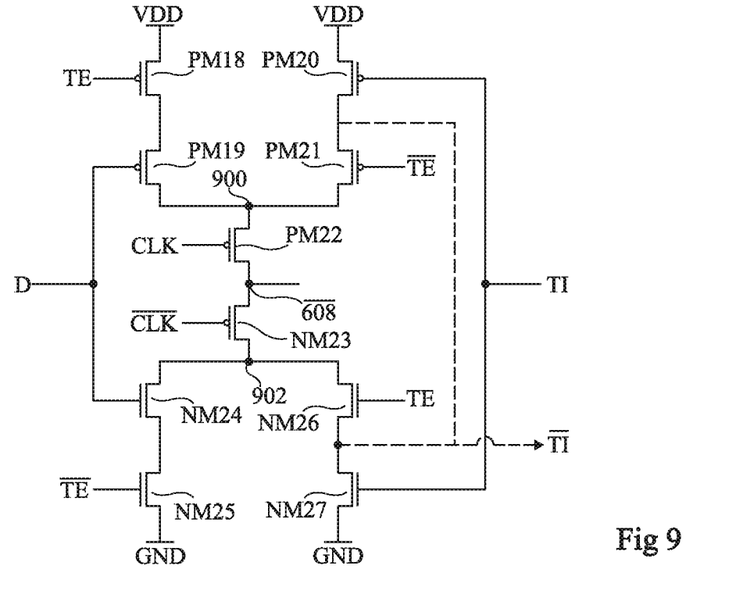

FIG. 9 illustrates one embodiment of the multiplexer 202 of a flip flop circuit of the type of flip flop circuit 200 of FIG. 2, and of the inverter 802 of FIG. 8.

The node VDD is coupled to a node 900 by a series association of two P-channel MOS transistors PM18 and PM19, in parallel with a series association of two P-channel MOS transistors PM20 and PM21. The transistor PM18 is controlled by the test control signal TE, the gate of the transistor PM19 is coupled to the data input D of the flip flop 200, the transistor PM20 has its gate coupled to the test chain input TI of the flip flop 200, and the transistor PM21 is controlled by the inverse $\overline{\text{TE}}$ of the signal TE, obtained for example from the signal TE for example by an inverter, not shown. The node 900 is coupled to the node $\overline{608}$ by a P-channel MOS transistor PM22 controlled by the clock signal CLK.

An N-channel MOS transistor NM23 couples the node $\overline{608}$ to a node 902. The transistor NM23 is controlled by the inverse $\overline{\text{CLK}}$ of the clock signal CLK. The node 902 is coupled to ground by a series association of two N-channel MOS transistors NM24 and NM25, in parallel with a series association of two N-channel MOS transistors NM26 and NM27. The transistor NM24 has its gate connected to the data input of the flip flop, the transistor NM25 is controlled by the inverse $\overline{\text{TE}}$ of the signal TE, the transistor NM26 is controlled by the signal TE and the transistor NM27 has its gate coupled to the test chain input TI.

The structure of FIG. 9 may be used in a flip flop of the type of flip flop 304 of FIG. 3B. The inverter 310 can thus be implemented without additional transistors by connecting the node between the transistors PM20 and PM21 to the node between the transistors NM26 and NM27, by a connection represented by dotted lines in the Figure. This connection corresponds to the output of the inverter 310 ($\overline{\text{TI}}$).

Figure 10:
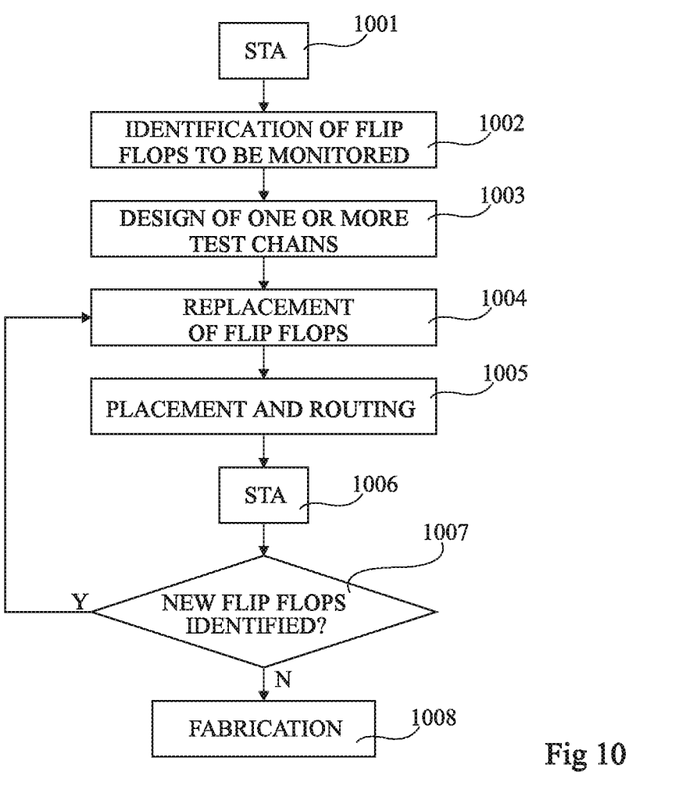
FIG. 10 is a flow chart illustrating steps in a method of designing a circuit according to an embodiment.

FIG. 10 is a flow chart illustrating steps in a method of circuit design according to one embodiment.

In a step 1001, a static timing analysis (STA) is performed for example on the basis of a circuit design. For example, the circuit design is represented by a hardware description language, such as VHDL ("VHSIC Hardware Description Language") or VHSIC ("Very High Speed Integrated Circuit") language.

In a step 1002, flip flops to be monitored design are identified on the basis of the static timing analysis. For example, the flip flops which are identified are those at the output of circuit paths for which the signal propagation time exceeds a threshold.

In a step 1003, the designing of one or more test chains is carried out, at least one of which groups together the flip flops identified in step 1002. In certain embodiments, one or more test chains might not contain any of the flip flops identified in step 1002.

In a step 1004, for the test chains having at least one flip flop identified in step 1002, these flip flops are replaced by the flip flop circuit 200 or 200' as described above, and the other flip flops of the chain are replaced for example by the flip flop circuit 304, 304'.

In a step 1005, a step of placement and routing of the circuit is implemented for example to take account of the modifications of the flip flops and the design of the test chains in steps 1003 and 1004.

In a step 1006, a new static timing analysis is for example performed, and in a step 1007, it is determined whether one or more new flip flop circuits to be monitored have been identified. If so, the method returns to step 1004. Otherwise, the next step is a step 1008.

In step 1008, the circuit design resulting from steps 1001 to 1007 is fabricated, for example by transmitting a file containing the circuit design to a manufacturing site.

Figure 11:
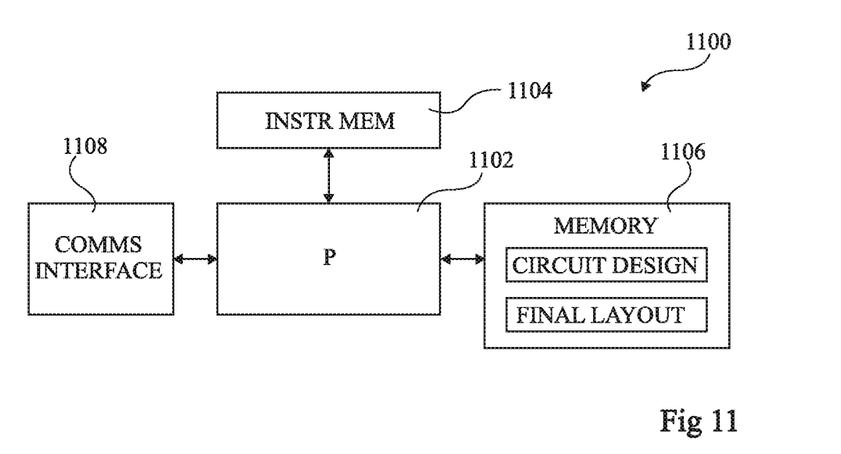
FIG. 11 schematically illustrates an embodiment of a circuit design device.

FIG. 11 schematically illustrates one embodiment of a circuit design device 1100. This device is for example adapted to implement the method of FIG. 10.

The device 1100 comprises for example a processing device (P) 1102, which may comprise one or more processors under the control of instructions stored by an instructions memory (INSTR MEM) 1104. A memory (MEMORY) 1106, which may be integrated with the memory 1104 or be a distinct memory device, is also coupled to the processing device 1102, and stores for example the circuit design (CIRCUIT DESIGN) to which the method of FIG. 10 is applied, and the circuit design (FINAL LAYOUT) resulting from the method.

A communication interface (COMMS INTERFACE) 1108 is provided for example to couple the processing device 1102 to one or more networks and to enable for example the transmitting of the circuit design to a plant for manufacture.

According to one advantage, the flip flop circuit described above makes it possible to monitor the time margin of each data bit coming from a critical path, the implementation being simple, and in particular the link to a control circuit being simple. Furthermore, the choice of the flip flop circuit described here allows a simplification of the design steps.

While particular embodiments have been described, variations and modifications will appear to the skilled person. In particular, even though in the embodiments of chains of flip flop circuits described, the transmission circuit in each flip flop circuit is adapted to transmit the alert signal to the following flip flop in an asynchronous manner, the transmission circuit of one flip flop circuit could be adapted to transmit the alert signal to the following flip flop circuit at each rising edge of the clock signal.

Furthermore, although particular embodiments have been described for latches storing a data bit when a validation signal is at high level, any type of latch adapted to store a data bit when the validation signal is at high level could be used.

Moreover, although a particular configuration of logic gates 502 and 504 has been described in relation with FIG. 5, making it possible to obtain a multiplexer 208, any other equivalent configuration could be used.

Furthermore, although the flip flop circuits described are provided to store data at the rising edges of a clock signal, the flip flops could also be adapted to store the data at the falling edges of the clock signal.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A flip flop circuit comprising:
    a data input and a clock input;
    a test chain input and a test chain output;
    a monitoring circuit configured to generate an alert if a time between arrival of a data bit and a clock edge of a clock signal is less than a threshold; and
    an alert transmission circuit configured to transmit, during a monitoring phase, an alert level to the test chain output in response to the monitoring circuit issuing the alert, and to apply the alert level to the test chain output in response to the alert level being on the test chain input.

2. The flip flop circuit of claim 1, wherein the alert transmission circuit is configured to maintain the alert level at the test chain output until an arrival of a reset signal at the alert transmission circuit.

3. The flip flop circuit of claim 2, wherein the alert transmission circuit comprises:
    an OR gate having an input configured to receive the alert and another input coupled to the test chain input; and
    an asynchronous latch having an input coupled to an output of the OR gate and an output coupled to the test chain output.

4. The flip flop circuit of claim 2, further comprising a control circuit configured to apply a monitoring control signal at a first level to begin the monitoring phase, the reset signal corresponding to a second level of the monitoring control signal.

5. The flip flop circuit of claim 1, wherein the monitoring circuit includes:
    a first latch configured to be active during a first state of the clock signal;
    a second latch in series with the first latch and configured to be active during the first state of the clock signal; and
    an exclusive OR gate having a first input connected to an output of the first latch and a second input connected to an output of the second latch, and an output configured to control generation of the alert.

6. The flip flop circuit of claim 5, further comprising:
    a third latch in series with the first latch and configured to be triggered to store the data bit by the clock edge switching from the first state to a second state of the clock signal.

7. The flip flop circuit of claim 5, further comprising:
    a latch configured to be triggered by the clock edge to provide the data bit at an output of the latch;
    an OR gate having a first input configured to receive the alert, a second input coupled to the test chain input, and an output; and
    a multiplexer having a first input electrically coupled to the output of the latch, a second input electrically coupled to the output of the OR gate, and an output corresponding to the test chain output.

8. An electronic chip comprising:
    a first flip circuit that includes:
        a first data input and a first clock input;
        a first test chain input and a first test chain output;
        a first monitoring circuit configured to generate a first alert if a time between arrival of a first data bit and a first clock edge of a clock signal is less than a threshold; and
        a first alert transmission circuit configured to apply, during a monitoring phase, an alert level to the first test chain output in response to the first monitoring circuit issuing the first alert, and to apply the first alert level to the first test chain output in response to the first alert level being at the first test chain input; and
    a second flip flop circuit that includes:
        a second data input and a second clock input;
        a second test chain input and a second test chain output, wherein the second test chain input is connected to the first test chain output;
        a second monitoring circuit configured to generate a second alert if a time between arrival of a second data bit and a second clock edge of the clock signal is less than a threshold; and
        a second alert transmission circuit configured to apply, during the monitoring phase, the alert level to the second test chain output in response to the second monitoring circuit issuing the second alert, and to apply the alert level to the second test chain output in response to the alert level being received at the second test chain input from the first test chain output.

9. The chip of claim 8, further comprising further flip circuits not having monitoring circuits, each further flip flop circuit including a further test chain input, a further test chain output, and a multiplexer configured to apply the alert level to the further test chain output during the monitoring phase if the further test chain input is at the alert level.

10. The chip of claim 8, further comprising a control circuit configured to receive the alert level generated by any one of the flip flop circuits and to perform one or more countermeasures of the following list:
   slow down the clock signal;
   increase a power supply voltage applied to transistors of the chip;
   modify back gate voltages of the transistors; and
   modify an accuracy of digital processing performed by the chip.

11. The chip of claim 8, wherein the first alert transmission circuit comprises:
   an OR gate having an input configured to receive the first alert and another input coupled to the first test chain input; and
   an asynchronous latch having an input coupled to an output of the OR gate and an output coupled to the first test chain output.

12. The chip of claim 8, wherein the first alert transmission circuit is configured to maintain the alert level at the first test chain output until an arrival of a reset signal at the first alert transmission circuit, the chip further comprising a control circuit configured to apply a monitoring control signal at a first level to begin the monitoring phase, the reset signal corresponding to a second level of the monitoring control signal.

13. The chip of claim 8, wherein the first monitoring circuit includes:
   a first latch configured to be active during a first state of the clock signal;
   a second latch in series with the first latch and configured to be active during the first state of the clock signal; and
   an exclusive OR gate having a first input connected to an output of the first latch and a second input connected to an output of the second latch, and an output configured to control generation of the first alert.

14. The chip of claim 13, wherein the first flip flop circuit:
   a third latch in series with the first latch and configured to be triggered to store the first data bit by the clock edge switching from the first state to a second state of the clock signal.

15. A storage device storing a library of standard cells for for designing electronic chips, the library comprising a standard cell defining a flip flop that includes:
   a data input and a clock input;
   a test chain input and a test chain output;
   a monitoring circuit configured to generate an alert if a time between arrival of a data bit and a clock edge of a clock signal is less than a threshold; and
   an alert transmission circuit configured to transmit, during a monitoring phase, an alert level to the test chain output in response to the monitoring circuit issuing the alert, and to apply the alert level to the test chain output in response to the alert level being on the test chain input.

16. The storage device of claim 15, wherein the library further comprises a further standard cell defining a further flip flop circuit not having a monitoring circuit, the further flip flop circuit including a test chain input, a test chain output, and a multiplexer configured to apply the alert level to the test chain output, during the monitoring phase, if the test chain input is at the alert level.

17. A method, comprising:
   performing timing analysis on a chip circuit design that includes a plurality of flip-flop circuits;
   identifying a selected flip flop circuit of the plurality of flip circuits as being a flip flop circuit to be monitored; and
   implementing in an integrated circuit the selected flip flop circuit using a first flip flop circuit that includes:
   a first data input and a first clock input;
   a first test chain input and a first test chain output;
   a first monitoring circuit configured to generate a first alert if a time between arrival of a first data bit and a first clock edge of a clock signal is less than a threshold; and
   a first alert transmission circuit configured to transmit, during a monitoring phase, an alert level to the first test chain output in response to the first monitoring circuit issuing the first alert, and to apply the alert level to the first test chain output in response to the alert level being on the first test chain input.

18. The method of claim 17, further comprising:
   identifying a further flip flop circuit of said plurality of flip circuits as being a flip flop circuit not to be monitored; and
   implementing the further flip flop circuit in the integrated circuit by a second flip flop circuit that includes a second test chain input, a second test chain output, and a multiplexer configured to apply the alert level to the second test chain output during the monitoring phase if the second test chain input is at the alert level.

19. The method of claim 18, further comprising implementing a test chain in the integrated circuit by connecting the first test chain output to the second test chain input.

20. The method of claim 17, further comprising implementing a test chain in the integrated circuit by connecting the first test chain output to a second test chain input of a second flip flop circuit that includes:
   a second data input and a second clock input;
   a second test chain output;
   a second monitoring circuit configured to generate a second alert if a time between arrival of a second data bit and a second clock edge of the clock signal is less than a threshold; and
   a second alert transmission circuit configured to transmit, during the monitoring phase, the alert level to the second test chain output in response to the second monitoring circuit issuing the second alert, and to apply the alert level to the second test chain output in response to the alert level being on the second test chain input.

* * * * *